(12) United States Patent
Lin et al.

(10) Patent No.: US 12,216,015 B2
(45) Date of Patent: **\*Feb. 4, 2025**

(54) MEMS RESONATOR SENSOR SUBSTRATE FOR PLASMA, TEMPERATURE, STRESS, OR DEPOSITION SENSING

(71) Applicant: Applied Materials, Inc., Santa Clara, CA (US)

(72) Inventors: Chuang-Chia Lin, San Ramon, CA (US); David Peterson, San Jose, CA (US); Philip Allan Kraus, San Jose, CA (US); Amir Bayati, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/531,478

(22) Filed: Dec. 6, 2023

(65) Prior Publication Data
US 2024/0102876 A1 Mar. 28, 2024

Related U.S. Application Data

(62) Division of application No. 17/367,250, filed on Jul. 2, 2021, now Pat. No. 11,874,189.

(51) Int. Cl.
*G01L 19/00* (2006.01)
*G01N 29/02* (2006.01)
(Continued)

(52) U.S. Cl.
CPC ..... *G01L 19/0092* (2013.01); *H03H 9/02015* (2013.01); *H03H 9/02574* (2013.01);
(Continued)

(58) Field of Classification Search
CPC .......... H01J 37/32917; H01J 37/32926; H01J 37/32935; H01J 37/32944;
(Continued)

(56) References Cited

U.S. PATENT DOCUMENTS

| | | |
|---|---|---|
| 2005/0030003 A1 | 2/2005 | Strang |
| 2009/0058561 A1 | 3/2009 | Pan et al. |

(Continued)

FOREIGN PATENT DOCUMENTS

| | | | |
|---|---|---|---|
| JP | 5618446 B2 | * | 11/2014 |
| JP | 2019/186655 A | | 10/2019 |

(Continued)

OTHER PUBLICATIONS

Preliminary Report on Patentability from PCT/US2022/032242 dated Jan. 11, 2024, 7 pgs.

(Continued)

*Primary Examiner* — Herbert K Roberts
(74) *Attorney, Agent, or Firm* — Schwabe, Williamson & Wyatt, P.C.

(57) ABSTRACT

Embodiments disclosed herein include diagnostic substrates and methods of using the diagnostic substrates to extract plasma parameters. In an embodiment, a diagnostic substrate comprises a substrate and an array of resonators across the substrate. In an embodiment, the array of resonators comprises at least a first resonator with a first structure and a second resonator with a second structure. In an embodiment, the first structure is different than the second structure.

13 Claims, 10 Drawing Sheets

(51) Int. Cl.
  *H03H 9/02* (2006.01)
  *H03H 9/145* (2006.01)
(52) U.S. Cl.
  CPC ....... *H03H 9/14502* (2013.01); *G01N 29/022* (2013.01); *G01N 2291/014* (2013.01)
(58) Field of Classification Search
  CPC ........... H01J 37/32954; H01J 37/32963; H01J 37/32972; H01J 37/32981; H01J 37/3299; G01N 29/036; G01N 29/12; G01N 29/022; G01N 2291/014
  See application file for complete search history.

(56) References Cited

U.S. PATENT DOCUMENTS

| | | |
|---|---|---|
| 2010/0033058 A1 | 2/2010 | Lee et al. |
| 2011/0266919 A1 | 11/2011 | Ikehara et al. |
| 2017/0023511 A1 | 1/2017 | Wilkinson et al. |
| 2019/0187105 A1 | 6/2019 | Ram et al. |

FOREIGN PATENT DOCUMENTS

| | | | |
|---|---|---|---|
| KR | 101225011 | B1 * | 11/2013 |
| TW | 201119225 | A | 6/2011 |

OTHER PUBLICATIONS

International Search Report and Written Opinion from PCT/US2022/032242 dated Nov. 24, 2022, 11 pgs.
Non-Final Office Action from U.S. Appl. No. 17/367,250 dated Mar. 21, 2023, 15 pgs.
Final Office Action from U.S. Appl. No. 17/367,250 dated Jun. 29, 2023, 10 pgs.
Official Letter from Taiwan Patent Application No. 111124784 dated Aug. 5, 2024, 9 pgs.

* cited by examiner

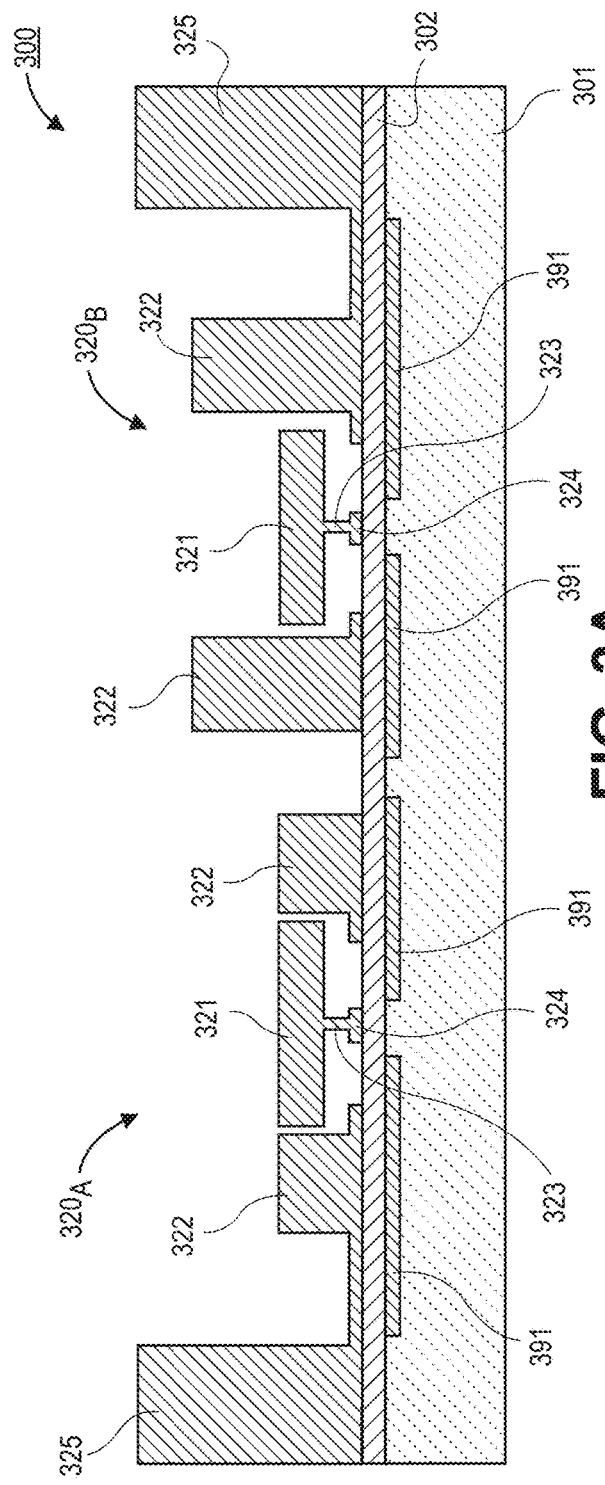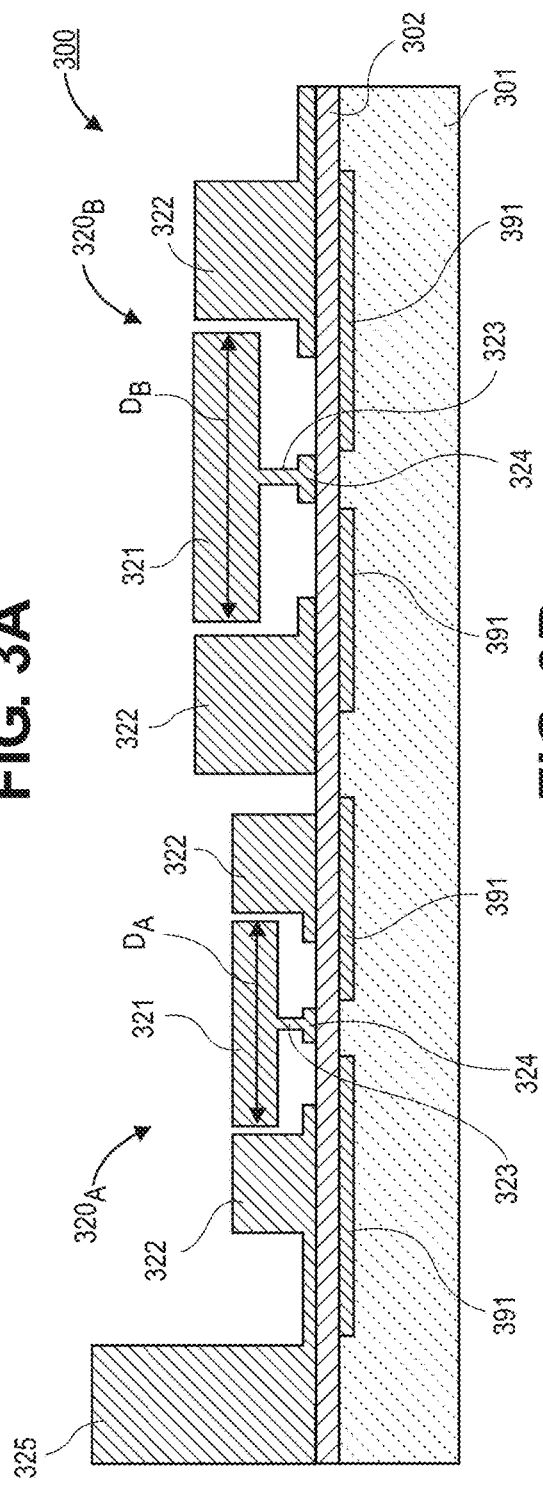
FIG. 3A
FIG. 3B

MEMS RESONATOR SENSOR SUBSTRATE FOR PLASMA, TEMPERATURE, STRESS, OR DEPOSITION SENSING

CROSS-REFERENCE TO RELATED APPLICATIONS

This application is a divisional of U.S. patent application Ser. No. 17/367,250, filed on Jul. 2, 2021, the entire contents of which are hereby incorporated by reference herein.

BACKGROUND

1) Field

Embodiments of the present disclosure pertain to the field of semiconductor processing and, in particular, to microelectromechanical systems (MEMS) sensors for the detection of various processing parameters in a processing chamber.

2) Description of Related Art

Semiconductor manufacturing processes are often implemented in plasma environments. For example, plasma processing chambers are used to deposit material on a substrate (e.g. plasma enhanced chemical vapor deposition (PE-CVD), plasma enhanced atomic layer deposition (PE-ALD), physical vapor deposition (PVD), and the like). Additionally, plasma processing chambers may be used to remove material from a substrate in an etching process. Typically, metrology used to quantify a given process is limited to the end result of the process. That is, after a substrate is processed (e.g., with an etching or deposition process), metrology is used to determine how much material was added (e.g., in a deposition process) or removed (e.g., in an etching process).

Currently, the plasma itself can be monitored with systems such as optical emission spectroscopy (OES). OES can be used to determine some aspects of a plasma, such as plasma composition, for example. However, OES is limited in that it cannot account for properties of the plasma such as electron density, plasma (electron) temperature, or spatial differences in such properties. Langmuir probes may also be used to measure plasma properties. A Langmuir probe measures an IV curve and uses the W curve to determine properties of the plasma. However, Langmuir probes are limited in that they are typically macro scale, and large numbers of them cannot easily be integrated across the surface of a substrate.

SUMMARY

Embodiments disclosed herein include diagnostic substrates and methods of using the diagnostic substrates to extract plasma parameters. In an embodiment, a diagnostic substrate comprises a substrate and an array of resonators across the substrate. In an embodiment, the array of resonators comprises at least a first resonator with a first structure and a second resonator with a second structure. In an embodiment, the first structure is different than the second structure.

In an additional embodiment, a diagnostic substrate comprises a substrate, a first resonator attached to the substrate, where the first resonator is electrically floating. In an embodiment, the diagnostic substrate further comprises a first guard ring around the first resonator, where the first guard ring has a first height. In an embodiment, the diagnostic substrate further comprises a second resonator attached to the substrate, where the second resonator is electrically floating, and a second guard ring around the second resonator, where the second guard ring has a second height, where the second height is greater than the first height Embodiments disclosed herein include a method of measuring a plasma parameter in a plasma chamber. In an embodiment, the method comprises providing a diagnostic substrate in the plasma chamber, where the diagnostic substrate comprises a first resonator with a first geometry and a second resonator with a second geometry. The method may further comprise measuring a baseline response from the first resonator and the second resonator in a vacuum without a plasma. In an embodiment, the method further comprises striking a plasma in the plasma chamber, where the first resonator and the second resonator are within the plasma and measuring a first resonance frequency of the first resonator and a second resonance frequency of the second resonator. In an embodiment, the method further comprises extracting the plasma parameter from the first resonance frequency and the second resonance frequency.

BRIEF DESCRIPTION OF THE DRAWINGS

FIG. 3A is a cross-sectional illustration of a diagnostic substrate with a first resonator with a first guard ring and a second resonator with a second guard ring that is a different height than the first guard ring, in accordance with an embodiment.

FIG. 3B is a cross-sectional illustration of a diagnostic substrate with a first resonator with a first dimension and a second resonator with a second dimension that is greater than the first dimension, in accordance with an embodiment.

DETAILED DESCRIPTION

Figure 1:
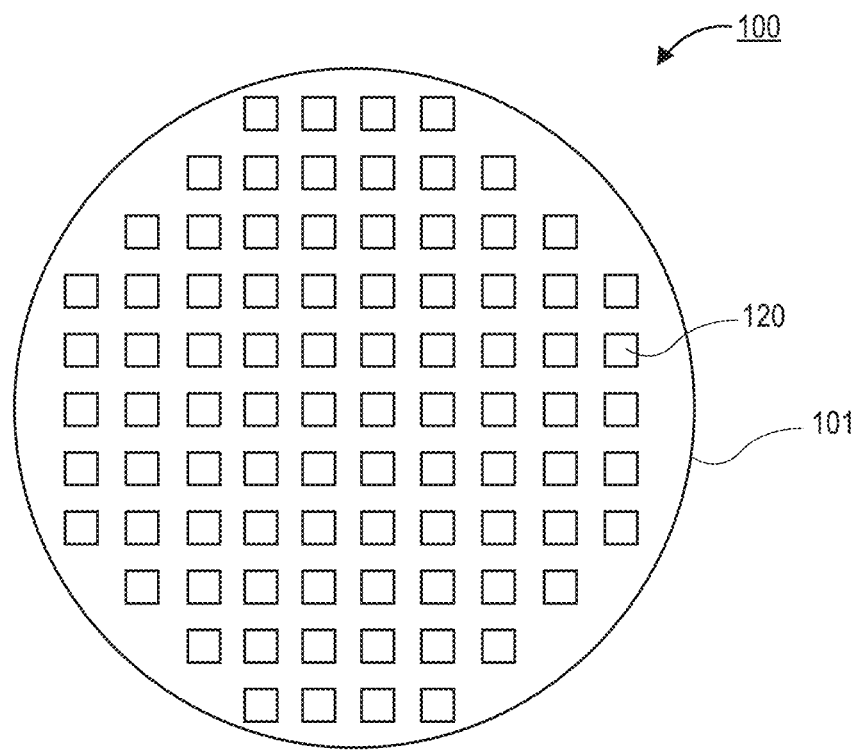
FIG. 1 is a plan view schematic of a diagnostic substrate with a plurality of resonators across a surface of the diagnostic substrate, in accordance with an embodiment.

Microelectromechanical systems (MEMS) sensors for the detection of various processing parameters in a processing chamber are described herein. In the following description, numerous specific details are set forth in order to provide a thorough understanding of embodiments of the present disclosure. It will be apparent to one skilled in the art that embodiments of the present disclosure may be practiced without these specific details. In other instances, well-known aspects, such as integrated circuit fabrication, are not described in detail in order to not unnecessarily obscure embodiments of the present disclosure. Furthermore, it is to be understood that the various embodiments shown in the Figures are illustrative representations and are not necessarily drawn to scale.

As noted above, it is currently difficult to measure plasma parameters in a plasma chamber. Currently, plasmas may be investigated using OES tools, but OES tools fail to provide plasma densities and electron temperatures. Additionally, OES tools cannot provide on substrate measurements such as material deposition, material etching, and the like. Additionally, measurements are not able to be taken in real time.

Accordingly, embodiments disclosed herein include diagnostic substrates that enable the ability to measure plasma parameters, in real time, during a plasma process. For example, plasma parameters may include, but are not limited to, electron density, electron temperature, electron energy distribution function (EEDF), ion density, and ion energy distribution function (IEDF). The embodiments disclosed herein may also be used to measure surface parameters, such as temperatures, deposition or etching rates, surface stress, surface charge, and other parameters on the diagnostic substrate.

In an embodiment, the diagnostic substrate may include a plurality of sensors. The sensors described herein may generally be referred to as resonator sensors. For example, the sensors may include MEMS sensors or RF resonators. Capacitively and piezoelectrically driven resonators may also be used. The sensors may include, but are not limited to, surface acoustic wave (SAW) sensors, bulk acoustic wave (BAW) sensors, film bulk acoustic resonator (FBAR) sensors, transversely-excited-bulk acoustic resonator (XBAR), membrane resonators, disk resonator, beam resonators, coil resonators, and the like. That is to say, while several particular examples of resonator sensors are described in greater detail herein, embodiments should not be construed as being limited by the particular examples described herein.

It is to be appreciated that embodiments disclosed herein also allow for real time characterization of the various plasma and/or surface properties being investigated. Particularly, embodiments disclosed herein include resonators that are coupled (either directly or indirectly) to antennas. An interrogator external to the diagnostic substrate (and external to the processing tool) may receive signals from the antennas.

In a particular embodiment, the array of sensors include sensors with different geometries. In one instance, the array of sensors may include sensors with top surfaces that have different heights from the underlying substrate. In such an embodiment, spatial information about the plasma may be provided since individual sensors will be exposed to different portions of the plasma and/or sheath. In another embodiment, the guard rings around the individual sensors may have different geometries. The different geometries of the guard rings may control the aperture around the resonator, allowing for different interactions with the plasma. In yet another embodiment, the guard rings may have a uniform geometry, but be applied different biases in order to control the aperture. Additionally, a single guard ring may be supplied a plurality of different biases to have a sensor that comprises different apertures.

Referring now to FIG. 1, a plan view illustration of a diagnostic substrate 100 is shown, in accordance with an embodiment. In the illustrated embodiment, the substrate 101 of the diagnostic substrate 100 is shown as being substantially circular, like a wafer. However, it is to be appreciated that the diagnostic substrate 100 is not limited to wafer like dimensions. For example, rectangular substrates 101 may also be used in some embodiments. In an embodiment, the substrate 101 may be a silicon substrate. However, it is to be appreciated that other materials may function as the substrate as well. For example, the substrate 101 may comprise a silicon on insulator (SOI) substrate 101, a III-V semiconductor substrate 101, a glass substrate 101, an organic substrate 101, or any combinations thereof.

As shown, an array of sensors 120 are distributed across a surface of the substrate 101. In the illustrated embodiment, the array of sensors 120 are arranged in a grid-like pattern. In other embodiments, a radial pattern may be used as well. Additional embodiments may include any suitable pattern. While fewer than one hundred sensors 120 are shown, it is to be appreciated that embodiments may include thousands or tens of thousands of sensors 120. The larger sensor outlines are for illustrative purposes, and embodiments are not limited to macro sized devices.

In an embodiment, the sensors 120 may be any type of MEMS or RF resonator. Sensors 120 may include, but are not limited to, surface acoustic wave (SAW) sensors, bulk acoustic wave (BAW) sensors, film bulk acoustic resonator (FBAR) sensors, membrane resonators, disk resonator, beam resonators, coil resonators, and the like. Several examples of particular resonator sensors are shown in greater detail below, but it is to be appreciated that many different types of resonators may be used in accordance with embodiments disclosed herein.

In an embodiment, each of the sensors 120 may be driven to a resonance frequency by circuitry that is not shown in FIG. 1. In an embodiment, the driving forces may be capacitive forces, piezoelectric forces, or the like. The resonance frequency may be transmitted from the diagnostic substrate 100 to an external interrogator (not shown) by an antenna (not shown) on the substrate 101. The sensors 120 may be directly or indirectly coupled to different antennas. The resonance frequency of the sensors 120 may change due to various conditions, such as a change in plasma parameters, deposition of material, removal of material, surface temperature, surface charge, stress, and the like. The change in resonance frequency may be used to quantify the various conditions being measured by the sensors 120.

Figure 2:
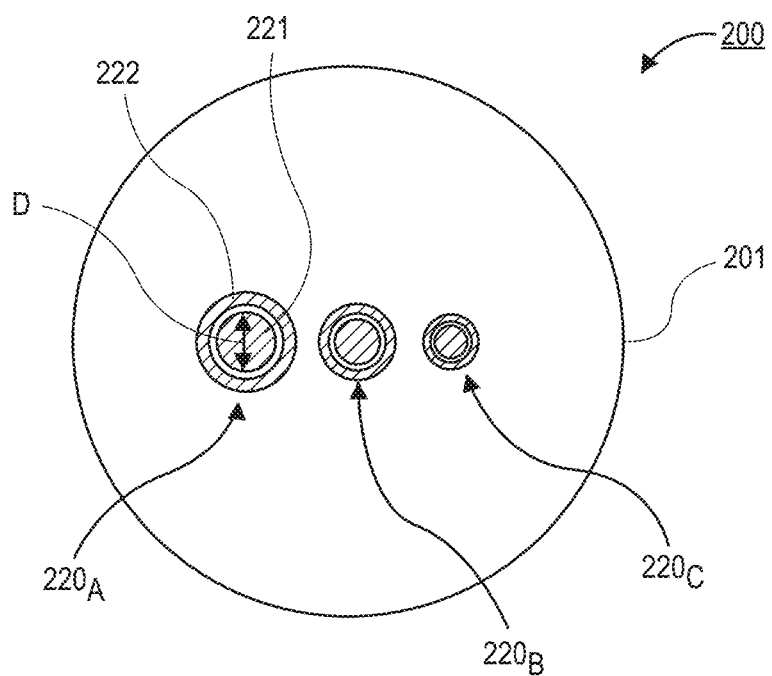
FIG. 2 is a plan view illustration of a diagnostic substrate with resonator sensors with varying dimensions, in accordance with an embodiment.

Referring now to FIG. 2, a plan view illustration of a diagnostic substrate 200 is shown, in accordance with an embodiment. In FIG. 2, a representative set of sensors $220_A$, $220_B$, and $220_C$ are shown for simplicity. It is to be appreciated that thousands or tens of thousands of sensors 220 may be provided on the substrate 201. In an embodiment, each of the sensors 220 may comprise a guard ring 222 and a resonator 221. As shown, the sensors $220_A$, $220_B$, and $220_C$ have different diameters D. The inclusion of sensors 220 with different diameter resonators 221 allows for the ability to provide more accurate values by solving systems of equations with more known variables. While the variation in the geometry of the sensors 220 is shown as being a different diameter D of the resonators 221, it is to be appreciated that other geometric changes may also be used to improve the sensitivity of the diagnostic substrate 200. For example, the resonators 221 may be a different heights, the guard rings 222 may have different spacings with respect to the resonators 221, or many other different variations.

Referring now to FIG. 3A, a cross-sectional illustration of a diagnostic substrate 300 is shown, in accordance with an embodiment. In an embodiment, the diagnostic substrate 300 comprises a substrate 301, a first sensors $320_A$, and a second sensor $320_B$. While two sensors $320_A$ and $320_B$ are shown in FIG. 3A, it is to be appreciated that hundreds, thousands, or tens of thousands of sensors 320 may be provided on the substrate 301. In an embodiment, the substrate 301 may be a semiconductor substrate, such as a silicon wafer. Though it is to be appreciated that the substrate 301 may comprise other materials or form factors, as described above with respect to FIG. 1.

In an embodiment, an insulating layer 302 is provided over the substrate 301. In some embodiments, the sensors 320 and necessary circuitry is provided over the insulating layer 302. In other embodiments, some (or all) of the circuitry for the sensors 320 may be provided within or below the insulating layer 302. In an embodiment, the insulting layer is an oxide (e.g., silicon oxide) or a nitride (e.g., silicon nitride). In an embodiment, electrodes 391 may be provided below the resonators 321. In the illustrated embodiment, the electrodes 391 are provided below the insulating layer 302. However, it is to be appreciated that the electrodes 391 may also be provided above the insulating layer 302 in some embodiments.

In an embodiment, each of the sensors 320 may comprise a resonator 321 and a guard ring 322. The resonator 321 may be a resonating disk in some embodiments. While a disk resonator 321 is shown in FIG. 3A, it is to be appreciated that the resonator 321 may be any resonating structure or structures. For example, the resonator 321 may comprise a capacitively driven resonator, a piezoelectrically driven resonator, an electromagnetic resonator, or an acoustic resonator. In a particular embodiment, the resonator 321 may alternatively be a SAW, a BAW, an FBAR, XBAR a membrane, disc, a beam, a coil, or the like. In an embodiment, the disk resonator 321 is raised up above the surface of the insulating layer 302 by a pad 324 and a post 323. In an embodiment, the resonator 321 may be a metallic material, such as copper, tungsten, nickel, or the like. In other embodiments, the resonator 321 may be polysilicon. In an embodiment, the resonator 321 may be electrically floating. That is, the resonator 321 may not be attached to a particular voltage or bias.

In an embodiment, the guard ring 322 may surround a perimeter of the disk resonator 321. The guard ring 322 may be connected to circuitry that is configured to hold the guard ring 322 at a bias potential. As will be described in greater detail below, the bias potential can control an aperture over the resonator 321 to limit or increase the interaction with the plasma. In an embodiment, an interior surface of the guard ring 322 is spaced away from an edge of the resonator 321. That is, while resonating, the resonator 321 may not contact the guard ring 322. In an embodiment, the electrodes 391 drive the resonance of the resonator 321. In other embodiments, the electrodes 391 may be omitted. In such embodiments, the resonators 321 may be driven by the guard rings 322. For example, a bias may be applied to the guard rings 322 with a DC signal, and an AC signal may be stacked onto the DC signal to drive the resonance in the resonators 321.

In an embodiment, a top surface of the guard ring 322 may be substantially coplanar with a top surface of the resonator 321 in the sensor $320_A$. In contrast, a top surface of the guard ring 322 may be substantially above a top surface of the resonator 321 in the sensor $320_B$. That is, the sensor $320_A$ may have a different geometry or structure than the sensor $320_B$. The difference in the geometry allows for the aperture above the resonators to be different when the same bias is applied to both of the guard rings 322.

In an embodiment, the sensors $320_A$ and $320_B$ are configured to measure one or more of plasma properties (e.g., plasma density, electron temperature, etc.), substrate temperatures, mass changes (e.g., due to deposition or etching), stress changes, or surface potential changes. In the case of plasma properties, electrons and/or ions from the plasma are attracted to the surface of the resonator 321. The increased charge on the resonator results in a change in the resonance frequency. By determining how many electrons and/or ions are attracted to the surface of the resonator 321, the plasma density or electron temperature may be determined. Similarly, changes in resonance frequency may also be the result of changes to mass, stress, temperature, etc. of the resonator 321. In order to isolate the effect of a single variable being changed, multiple different resonators with different geometries, different biases, or other variations may be used. Having multiple different geometries allows for a system of equations setup to be used to isolate a given variable that is desired to be measured.

In an embodiment, the sensors $320_A$ and $320_B$ may each be coupled to an antenna 325. In an embodiment, the antenna 325 may be as simple as a conductive trace. In other embodiments, more complex antenna architectures may be provided, such as a patch antenna or a dual patch antenna. A portion of the antennas 325 are shown in FIG. 3A for simplicity. Generally, the size of the antennas 325 is significantly larger than the size of the sensors $320_A$ and $320_B$. The antenna 325 allows for the resonant frequency of the sensors $320_A$ and $320_B$ to be wirelessly transmitted to an interrogator external to the diagnostic substrate 300. In an embodiment, the sensors $320_A$ and $320_B$ may be directly coupled to the antennas 325, as shown in FIG. 3A. In other embodiments, the sensors $320_A$ and $320_B$ may be indirectly coupled to the antennas 325 (e.g., by capacitive coupling or the like). In an embodiment, RF circuitry may be fabricated on the substrate between the antennas 325 and the sensors $320_A$ and $320_B$. For example, the RF circuitry may comprise shielded transmission lines, couplers, and/or filters.

Referring now to FIG. 3B, a cross-sectional illustration of a diagnostic substrate 300 is shown, in accordance with an additional embodiment. In an embodiment, the diagnostic substrate 300 comprises a substrate 301 with an insulating layer 302 over the substrate 301. The substrate 301 and the insulating layer 302 may be substantially similar to the substrate 301 and the insulating layer 302 described above with respect to FIG. 3A.

In an embodiment, the diagnostic substrate 300 may comprise a first sensor $320_A$ and a second sensor $320_B$. In an embodiment, the first sensor $320_A$ and the second sensor $320_B$ may each have a resonator 321 that is supported on a post 323 and a pad 324 over the insulating layer 302. The first sensor $320_A$ and the second sensor $320_B$ may also each have a guard ring 322 that surrounds a perimeter of the resonator 321. In an embodiment, the first sensor $320_A$ and the second sensor $320_B$ may be communicatively coupled to antennas 325.

The first sensor $320_A$ may have a different geometry or structure than the second sensor $320_B$. In the illustrated embodiment, the first sensor $320_A$ has a resonator 321 with a first diameter $D_A$, and the second sensor $320_B$ has a resonator 321 with a second diameter $D_B$. The second diameter $D_B$ may be greater than the first diameter $D_A$. As such, the sensor $320_A$ and the sensor $320_B$ may be used together to provide enhanced sensitivity to the measurements of the plasma properties.

Figure 3C:
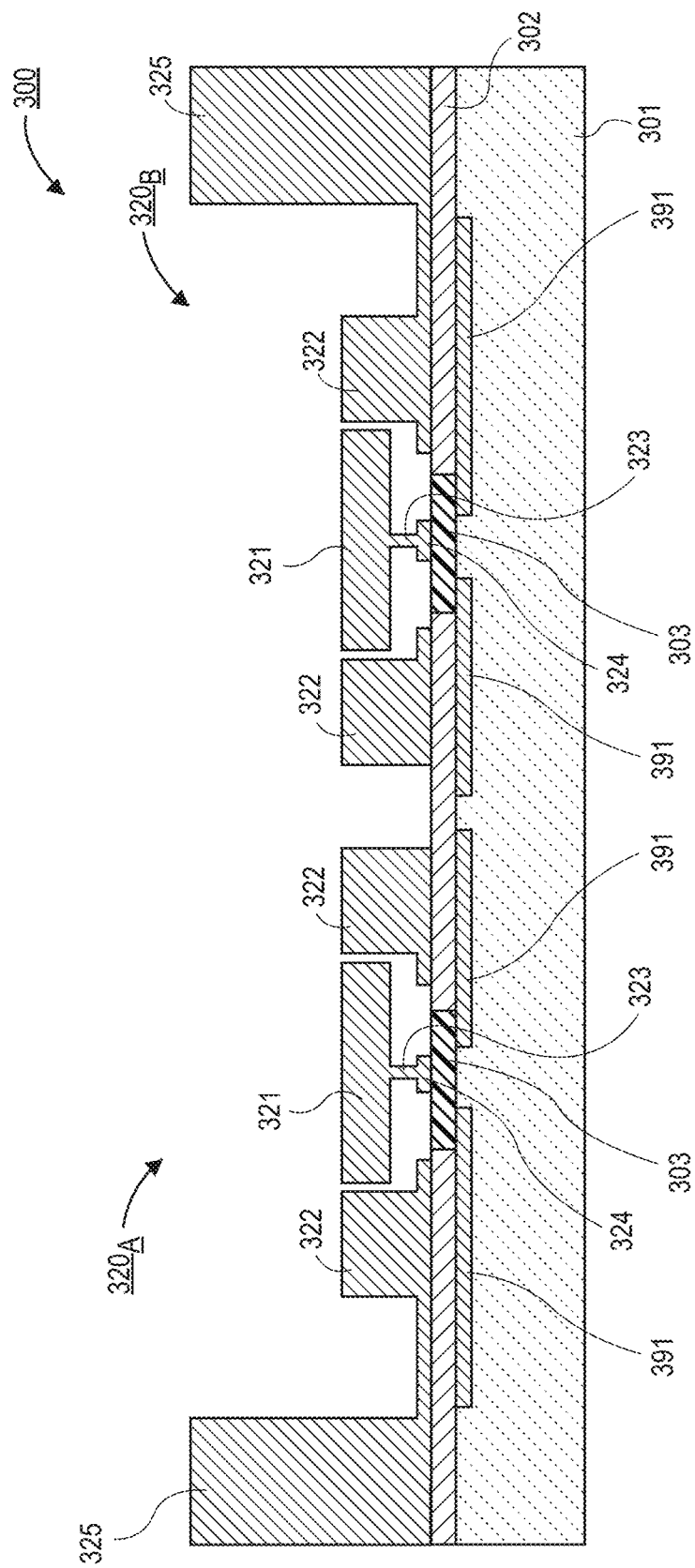
FIG. 3C is a cross-sectional illustration of a diagnostic substrate with a leaky insulator below the resonators, in accordance with an embodiment.

Referring now to FIG. 3C, a cross-sectional illustration of a diagnostic substrate 300 is shown, in accordance with an additional embodiment. The diagnostic substrate 300 in FIG. 3C may be substantially similar to the diagnostic substrate 300 in FIG. 3A, with the exception of a discharge layer 303 below the resonators 321. The discharge layer 303 may be a high resistivity material layer. For example, the discharge layer 303 may comprise a low-doped silicon. The high resistivity allows for charge to slowly bleed charge. This allows for the sensors 320 to be reset without the need for a discharge switch.

Figure 4:
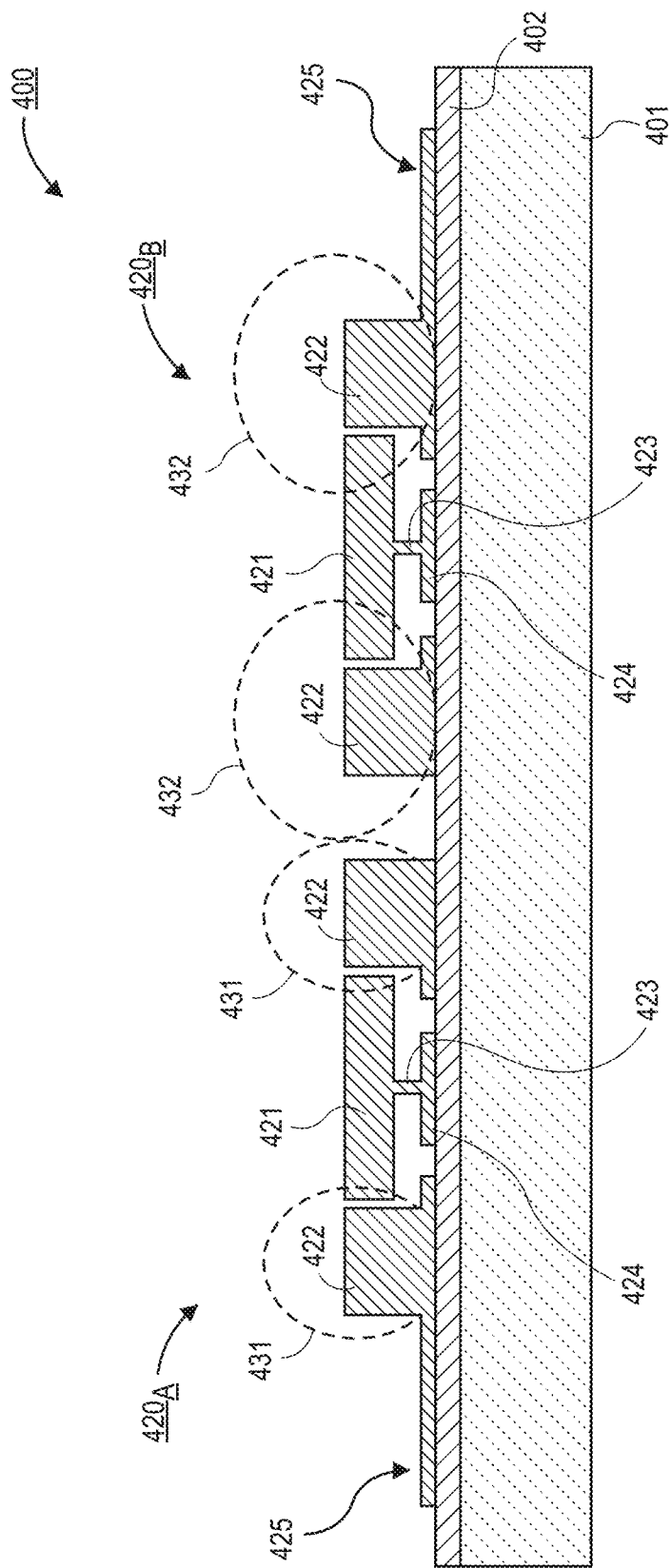
FIG. 4 is a cross-sectional illustration of a diagnostic substrate with a first resonator with a guard ring with a first bias and a second resonator with a guard ring with a second bias that is larger than the first bias, in accordance with an embodiment.

Referring now to FIG. 4, a cross-sectional illustration of a diagnostic substrate 400 is shown, in accordance with an embodiment. In an embodiment, the diagnostic substrate 400 comprises a substrate 401 and an insulating layer 402 over the substrate 401. The substrate 401 and the insulating layer 402 may be substantially similar to the substrate 301 and the insulating layer 302 described in greater detail above, and will not be repeated here.

In an embodiment, a pair of sensors $420_A$ and $420_B$ are shown in FIG. 4. While two sensors $420_A$ and $420_B$ are shown, it is to be appreciated that hundreds, thousands, or tens of thousands of sensors 420 may be provided across the substrate 401. In an embodiment, the geometry of the first sensor $420_A$ may be substantially similar to the geometry of the second sensor $420_B$. That is, the first sensor $420_A$ and the second sensor $420_B$ may each comprise a resonator 421 supported by a post 423 and pad 424 and surrounded by a guard ring 422. While shown as a disk resonator 421, it is to be appreciated that the resonator 421 may comprise any suitable resonator such as those described in greater detail above.

The difference between the first sensor $420_A$ and the second sensor $420_B$ is the bias that is applied to the guard rings 422. For example, a first bias 431 is applied to the guard rings 422 around the first sensor $420_A$, and a second bias 432 is applied to the guard rings 422 around the second sensor $420_B$. The second bias 432 may be greater than the first bias 431. The larger bias 432 reduces the aperture above the resonator 421 compared to the aperture above the resonator 421 provided by the bias 431. That is, the distance between the electromagnetic field lines is larger in the first sensor $420_A$ than the distance between the electromagnetic field lines in the second sensor $420_B$. As such, different amounts of electrons can be collected by the different sensors $420_A$ and $420_B$. The differences allow for a system of equations to be set up to isolate the variable of interest, such as plasma density or electron temperature. In an embodiment, the sensors $420_A$ and $420_B$ may be coupled to an external interrogator (not shown) by antennas 425.

In an embodiment, the first bias 431 and the second bias 432 may be a DC bias. In other embodiments, the biases 431 and 432 may be an AC bias. Embodiments may also include a DC bias with an AC bias added on top of the DC bias. In an embodiment, the first bias 431 and the second bias 432 may be dynamic biases. For example, bias sweeps through a plurality of different voltages may be used in some embodiments.

Figure 5A:
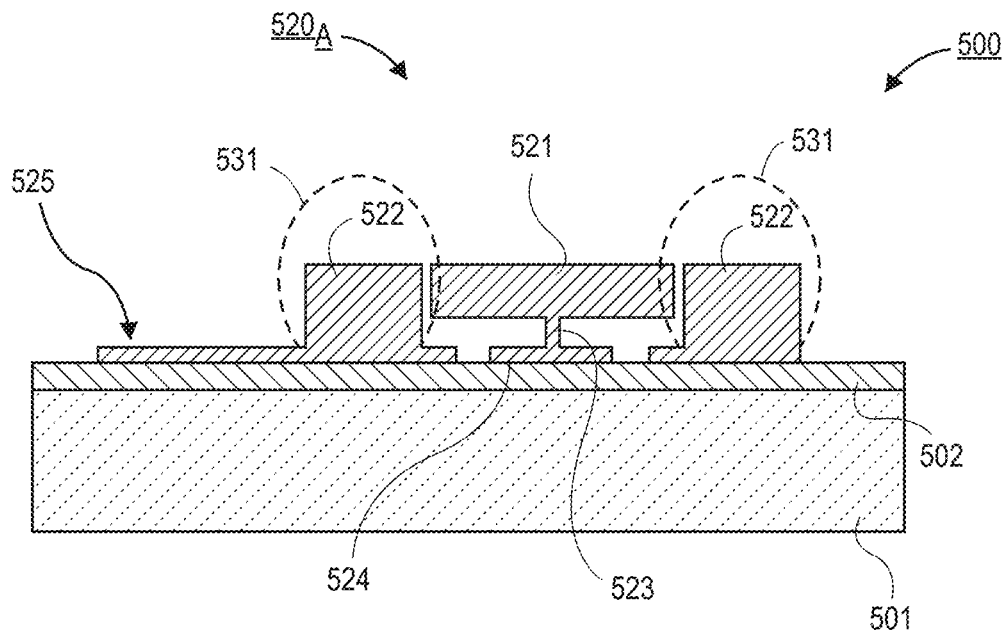
FIG. 5A is a cross-sectional illustration of a diagnostic substrate with a first resonator with a guard ring with a first bias, in accordance with an embodiment.
Figure 5B:
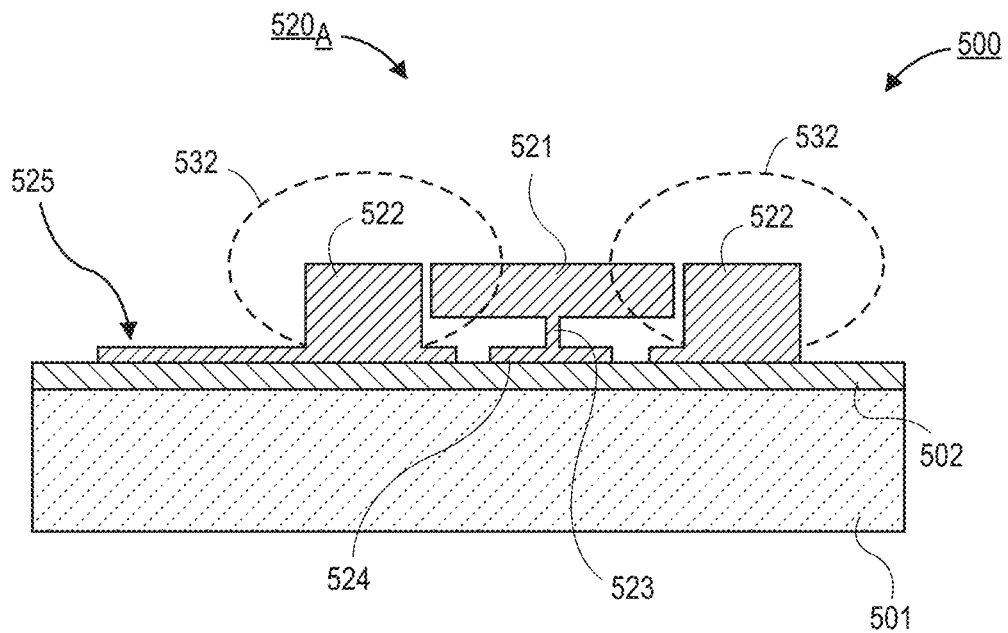
FIG. 5B is a cross-sectional illustration of a diagnostic substrate with the first resonator with the guard ring with a second bias that is larger than the first bias, in accordance with an embodiment.

Referring now to FIGS. 5A and 5B, a pair of cross-sectional illustrations of diagnostic substrate 500 with a first sensor $520_A$ is shown, in accordance with an embodiment. The diagnostic substrate 500 may comprise a substrate 501 and an insulative layer 502 similar to the substrate 301 and insulating layer 302 described in greater detail above. The first sensor $520_A$ comprises a resonator 521 supported by a post 523 and a pad 524. A guard ring 522 may surround a perimeter of the resonator 521. While shown as a disk resonator 521, it is to be appreciated that the resonator 521 may be any suitable resonator such as those described in greater detail above. The first sensor $520_A$ may be coupled to an antenna 525 to wirelessly communicate with an external interrogator (not shown).

As shown in FIG. 5A, the guard ring 522 is supplied with a first bias 531. The first bias 531 results in a first aperture over the resonator 521. In FIG. 5B, the guard ring 522 is supplied with a second bias 532. The second bias 532 results in a second aperture over the resonator 521 that is smaller than the first aperture. That is, a single sensor 520 may be supplied with different biases. In some embodiments, the bias may be a bias sweep that encompasses a plurality of different biases. In an embodiment, the bias may comprise a DC bias, an AC bias, or a DC bias and an AC bias.

Figure 6A:
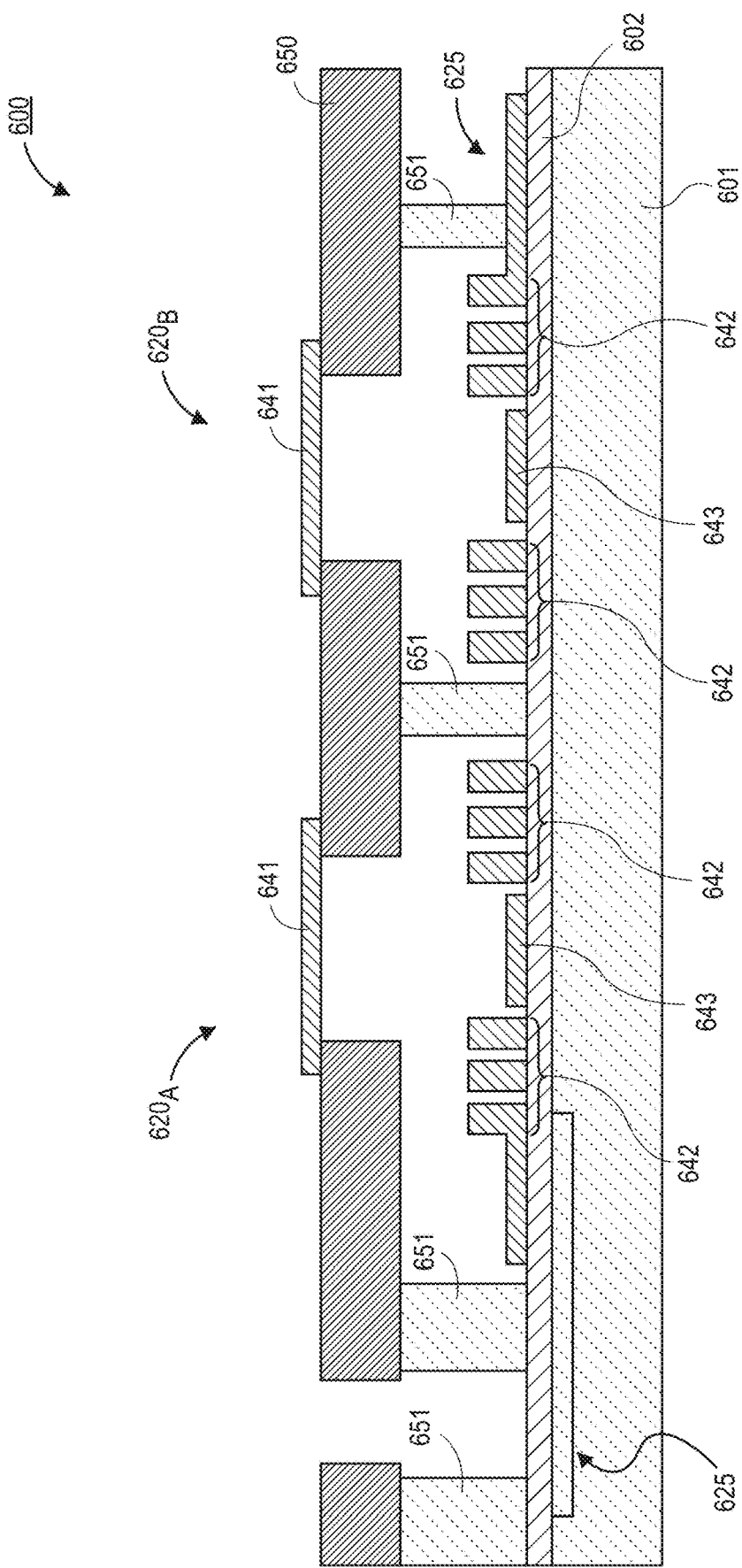
FIG. 6A is a cross-sectional illustration of a diagnostic substrate with resonators that are above a cover and with driving and sensing circuitry below the cover, in accordance with an embodiment.

Referring now to FIG. 6A, a cross-sectional illustration of a diagnostic substrate 600 is shown, in accordance with an additional embodiment. In an embodiment, the diagnostic substrate 600 comprises a substrate 601 and an insulating layer 602 over the substrate 601. The substrate 601 and the insulating layer 602 may be substantially similar to the insulating layer 302 and substrate 301 described in greater detail above.

In an embodiment, the diagnostic substrate 600 may comprise a frame 650 that is supported by pillars 651. The driving and sensing circuitry of a first sensor $620_A$ and a second sensor $620_B$ may be below the frame 650. As such, the driving and sensing circuitry is protected from a processing environment. The driving and sensing circuitry may comprise one or more coils 642 and a core 643 positioned below a resonator 641. The core 643 may be a magnetic material that improves the flux of the coils 642. For example, the core 643 may comprise a ferrite material. The first sensor $620_A$ and the second sensor $620_B$ may be directly or indirectly coupled to antennas 625 to allow for wireless communication with an interrogator (not shown) external to the diagnostic substrate 600.

Figure 6B:
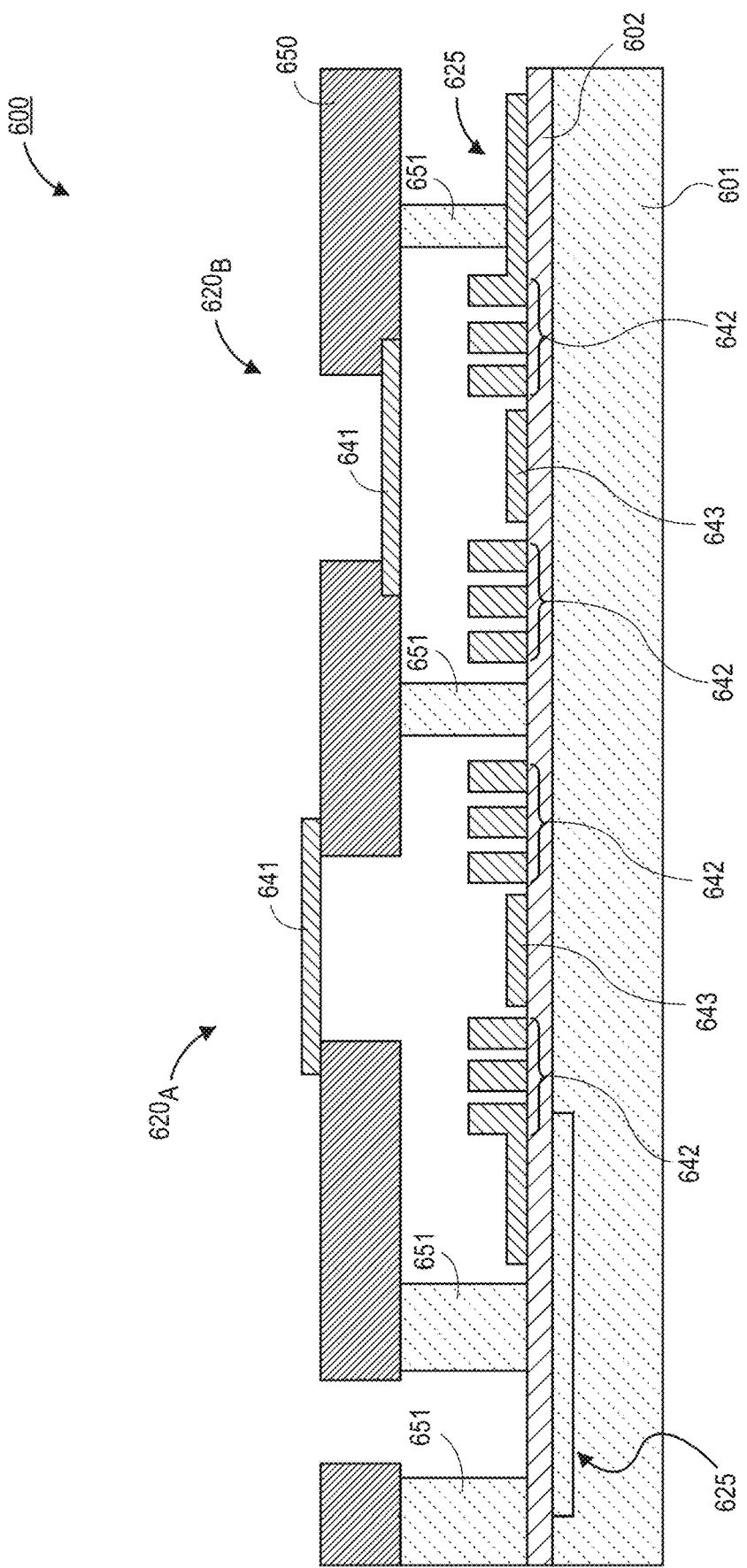
FIG. 6B is a cross-sectional illustration of a diagnostic substrate with resonators at different heights above a cover with driving and sensing circuitry below the cover, in accordance with an embodiment.

The resonator 641 may be a membrane that spans across an opening in the frame 650. As shown in FIG. 6A, the resonators 641 in the first sensor $620_A$ and the second sensor $620_B$ are provided at the same height relative to the substrate 601. In other embodiments, as shown in FIG. 6B, the resonator 641 of the first sensor $620_A$ may be at a different height relative to the substrate 601 than the resonator 641 of the second sensor $620_B$. In an embodiment, the resonator 641 of the second sensor $620_B$ may be provided over a bottom surface of the frame 650. While shown as covering substantially all of the substrate 601 in FIGS. 6A and 6B, it is to be appreciated that the frame 650 may be located over the sensor regions, and the remainder of the substrate 601 may be uncovered by the frame 650.

Figure 7A:
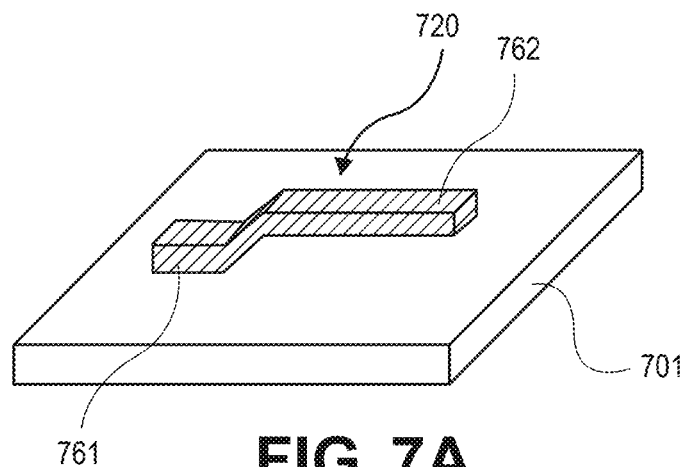
FIG. 7A is a schematic of an additional resonator structure that may be used in accordance with diagnostic substrates described herein, in accordance with an embodiment.
Figure 7B:
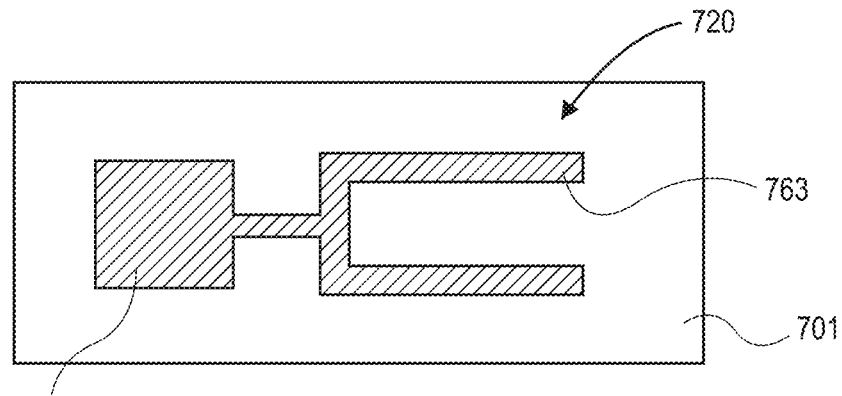
FIG. 7B is a schematic of an additional resonator structure that may be used in accordance with diagnostic substrates described herein, in accordance with an embodiment.
Figure 7C:
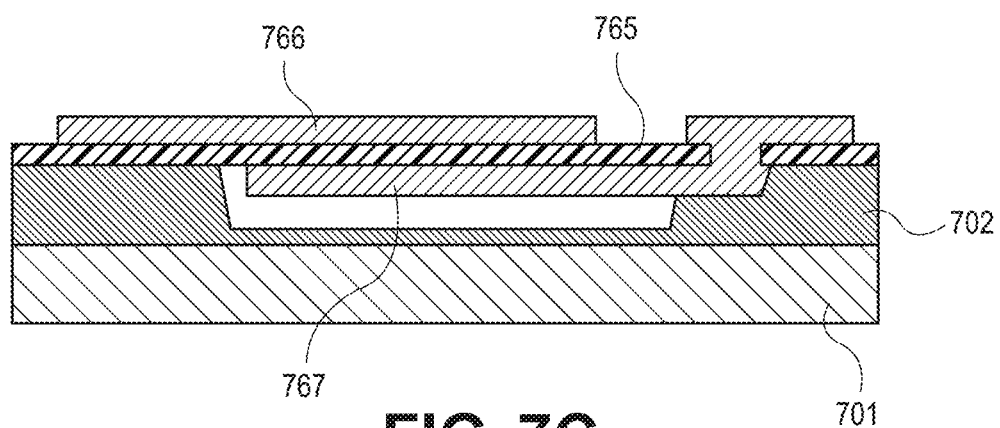
FIG. 7C is a schematic of an additional resonator that uses piezoelectric actuation, in accordance with an embodiment.

In the embodiments described above a disk resonator and a membrane resonator are described in detail. However, it is to be appreciated that any resonator architecture may be used in embodiments disclosed herein. For example, in FIG. 7A, a perspective view illustration of a cantilever beam resonator 720 is shown, in accordance with an embodiment. The beam resonator 720 may include an anchor 761 and a beam 762 that extends out from the anchor 761. The anchor 761 may be coupled (directly or indirectly) to a substrate 701. In FIG. 7B, a top view of a resonator 720 that is similar in operation to a tuning fork is shown, in accordance with an embodiment. In FIG. 7B, the resonator 720 comprises an anchor 761 and a resonating fork 763 attached to the anchor 761. The anchor 761 may be coupled (directly or indirectly) to the substrate 701. In addition to acoustic resonators, such as the ones shown in FIGS. 7A and 7B, piezoelectric resonators may also be used. An example of a piezoelectric resonator is shown in FIG. 7C. As shown, a piezoelectric layer 765 may span across a cavity in an insulating layer 702. A first electrode 767 is below the piezoelectric layer 765, and a second electrode 766 is above the piezoelectric layer 765. While three additional examples of resonators are shown, it is to be appreciated that embodiments are not limited to any particular configuration.

Figure 8:
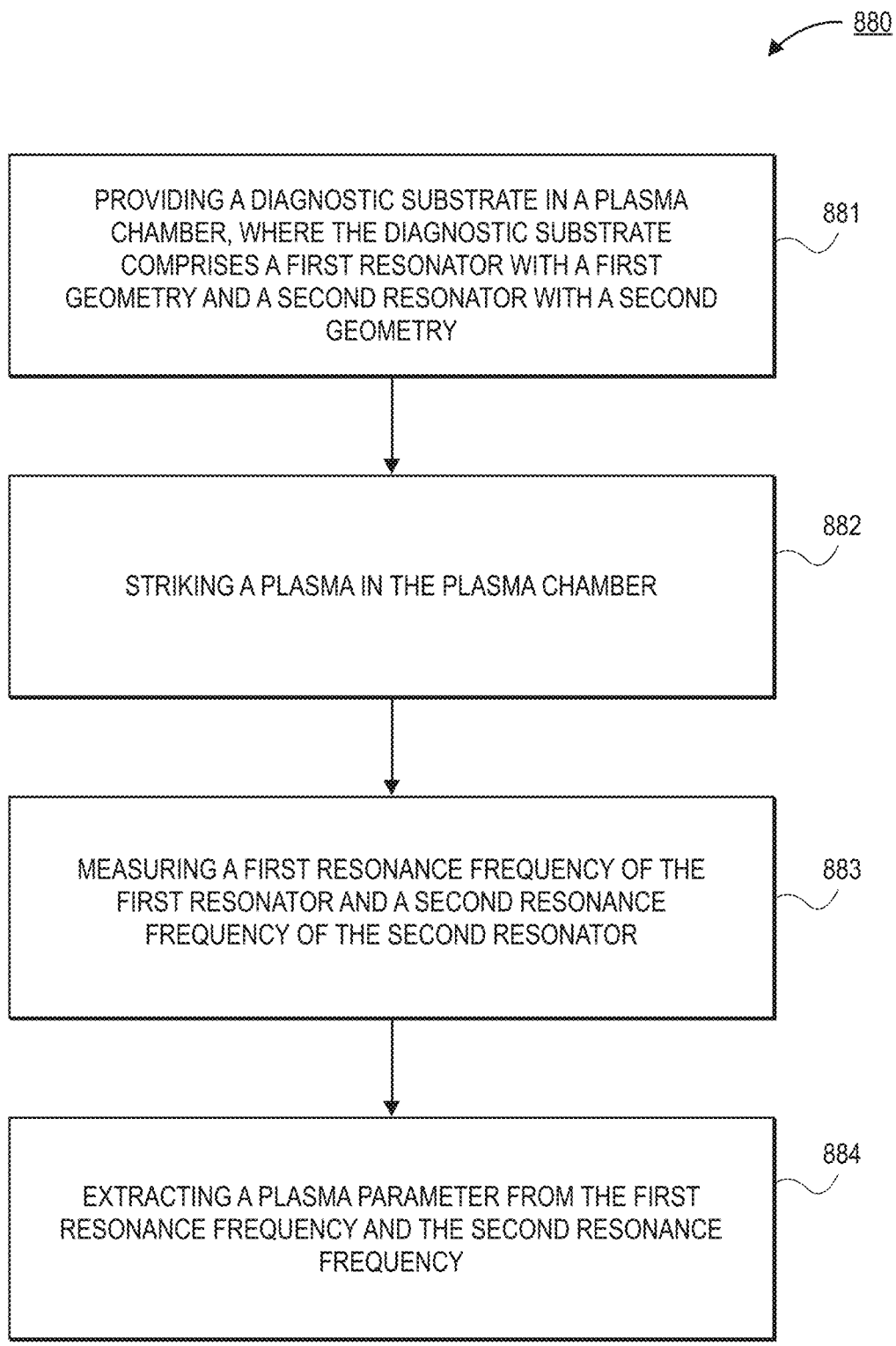
FIG. 8 is a flow diagram of a process for determining plasma properties using a diagnostic substrate, in accordance with an embodiment.

Referring now to FIG. 8, a flow diagram of a process 880 for determining plasma properties in a plasma chamber is shown, in accordance with an embodiment. In an embodiment, the process 880 may begin with operation 881 which comprises providing a diagnostic substrate in a plasma chamber. In an embodiment, the diagnostic substrate comprises a first resonator with a first geometry and a second resonator with a second geometry. In an embodiment, the different resonators may be any resonators such as those described in greater detail above. For example, the difference in geometry may be a difference in the heights of the resonators relative to an underlying substrate. In other embodiments, the difference in geometry may be a differences in the height of the guard ring surrounding the resonators. In an embodiment, a biases applied to the guard rings may be different for different resonators. In other embodiments, the bias may be modulated for each of the resonators. For example, a bias sweep may be used for each of the resonators. The bias applied to the resonators may comprise an AC component and a DC component in some embodiments.

In an embodiment, process 880 may continue with operation 882, which comprises striking a plasma in the plasma chamber. In an embodiment, the plasma may be used for any type of plasma process. For example, the plasma may be for a PE-CVD process, a PE-ALD process, a PVD process, an etching process, or any other semiconductor manufacturing process. However, in some embodiments, a baseline response of the resonators may be determined before the striking of the plasma. For example, the process 880 may also comprise measuring a baseline response from the first resonator and the second resonator in a vacuum without a plasma.

In an embodiment, process 880 may continue with operation 883 which comprises measuring a first resonance frequency of the first resonator and a second resonance frequency of the second resonator. In an embodiment, the resonance frequencies may be different due to variations in the geometries and/or variations in the bias applied to guard rings around the resonators. In an embodiment, the first resonance frequency and the second resonance frequency may be different than the frequency of the plasma. In a particular embodiment, the first resonance frequency and the second resonance frequency may be approximately 100 MHz or greater.

In an embodiment, process 880 may continue with operation 884 which comprises extracting a plasma parameter from the first resonance frequency and the second resonance frequency. In an embodiment, the resonant frequencies may be wirelessly transmitted to an interrogator external to the plasma chamber by antennas on the diagnostic substrate. The plasma parameter may include electron density, electron temperature, EEDF, ion density, and IEDF, or any other detectable plasma parameter. In some embodiments the plasma parameter may be a spatial plasma parameter. That is, a single plasma parameter (e.g., plasma density) may be measured at different Z-heights relative to the diagnostic substrate.

It is to be appreciated that process 880 may be used to provide different controls or chamber health monitoring. For example, process 880 may be used to provide process baselining, fingerprinting, drift monitoring, chamber matching, or other chamber control. Additionally, it is to be appreciated that process 880 may be used in conjunction with machine learning and/or artificial intelligence modules. In such embodiments, the process 880 may be used to generate data (e.g., plasma parameters) that can be fed as inputs into a machine learning and/or artificial intelligence module. The machine learning and/or artificial intelligence modules may use the generated data from the process 880 to provide process control functionality to a processing tool or processing tools such as, but not limited to, process baselining, fingerprinting, drift monitoring, chamber matching or other chamber control.

Figure 9:
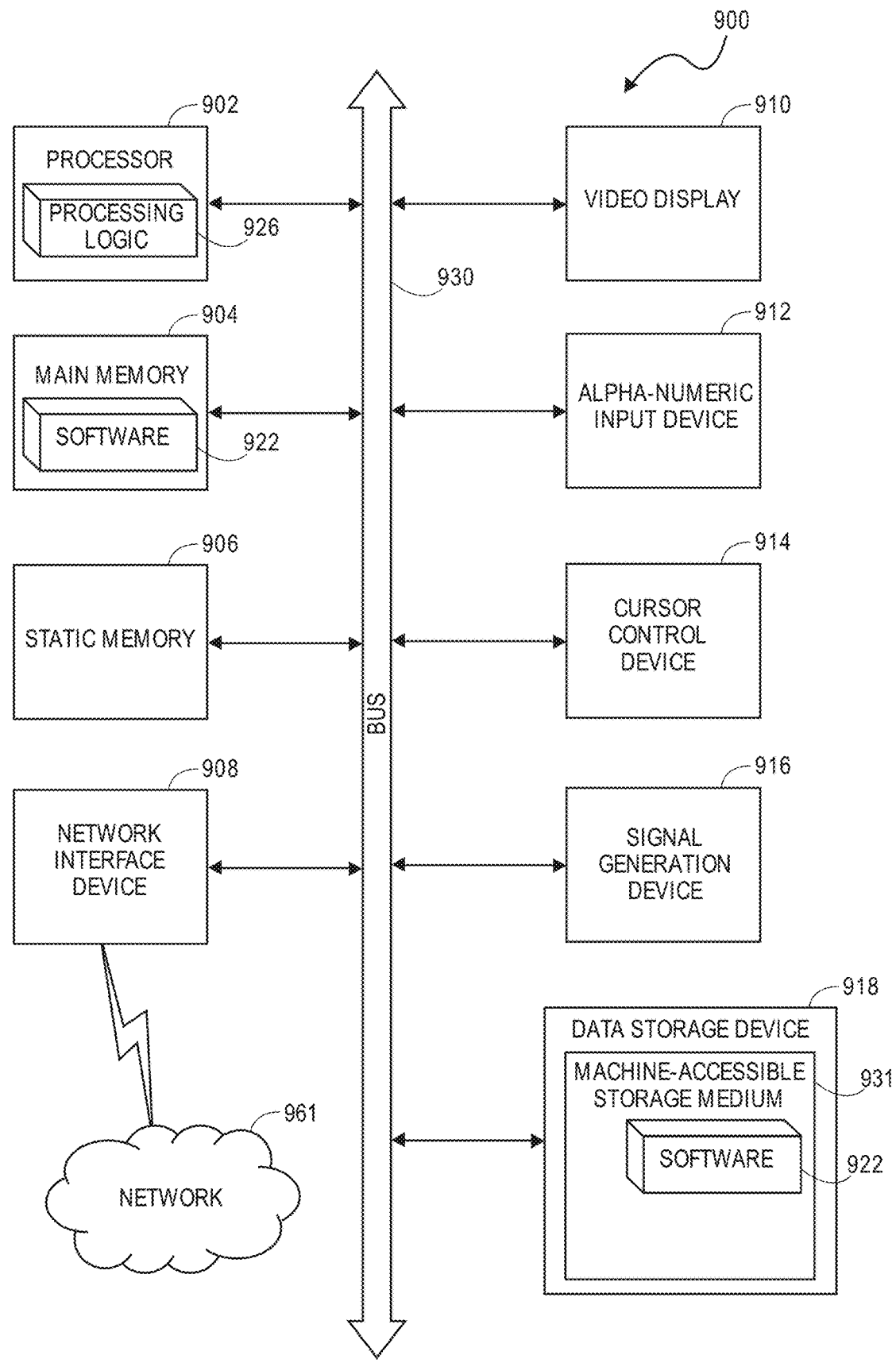
FIG. 9 illustrates a block diagram of an exemplary computer system, in accordance with an embodiment of the present disclosure.

FIG. 9 illustrates a diagrammatic representation of a machine in the exemplary form of a computer system 900 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 900 includes a processor 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), MRAM, etc.), and a secondary memory 918 (e.g., a data storage device), which communicate with each other via a bus 930.

Processor 902 represents one or more general-purpose processing devices such as a microprocessor, central processing unit, or the like. More particularly, the processor 902 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 902 may also be one or more special-purpose processing devices such as an application specific integrated circuit (ASIC), a field programmable gate array (FPGA), a digital signal processor (DSP), network processor, or the like. Processor 902 is configured to execute the processing logic 926 for performing the operations described herein.

The computer system 900 may further include a network interface device 908. The computer system 900 also may include a video display unit 910 (e.g., a liquid crystal display (LCD), a light emitting diode display (LED), or a cathode ray tube (CRT)), an alphanumeric input device 912 (e.g., a keyboard), a cursor control device 914 (e.g., a mouse), and a signal generation device 916 (e.g., a speaker).

The secondary memory 918 may include a machine-accessible storage medium (or more specifically a computer-readable storage medium) 931 on which is stored one or more sets of instructions (e.g., software 922) embodying any one or more of the methodologies or functions described herein. The software 922 may also reside, completely or at least partially, within the main memory 904 and/or within the processor 902 during execution thereof by the computer system 900, the main memory 904 and the processor 902 also constituting machine-readable storage media. The software 922 may further be transmitted or received over a network 961 via the network interface device 908.

While the machine-accessible storage medium 931 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

In accordance with an embodiment of the present disclosure, a machine-accessible storage medium has instructions stored thereon which cause a data processing system to perform a method of measuring plasma parameters in a plasma chamber using a diagnostic substrate with resonators that have a plurality of different geometries.

Thus, methods for measuring plasma parameters have been disclosed.

What is claimed is:

1. A method of measuring a plasma parameter in a plasma chamber, comprising:
   providing a diagnostic substrate in the plasma chamber, wherein the diagnostic substrate comprises a first resonator with a first geometry and a second resonator with a second geometry;
   measuring a baseline response from the first resonator and the second resonator in a vacuum without a plasma;
   striking the plasma in the plasma chamber, wherein the first resonator and the second resonator are within the plasma;
   measuring a first resonance frequency of the first resonator and a second resonance frequency of the second resonator;
   extracting the plasma parameter or a wafer parameter from the first resonance frequency and the second resonance frequency; and
   measuring a resonator response of the first resonator and the second resonator to a varying bias applied to the first resonator and the second resonator by a first guard ring and a second guard ring.

2. The method of claim 1, wherein the plasma parameter is electron density, electron temperature, electron energy distribution function (EEDF), ion density, or ion energy distribution function (IEDF), and wherein the wafer parameter is substrate temperature, mass changes, stress changes, or surface potential changes.

3. The method of claim 1, wherein the first resonance frequency and the second resonance frequency are different from a plasma frequency.

4. The method of claim 1, further comprising:
   applying a first bias around the first resonator; and
   applying a second bias around the second resonator, wherein the first bias is different than the second bias, and wherein the first bias and the second bias are modulated biases.

5. The method of claim 1, further comprising:
   using the plasma parameter as an input for an artificial intelligence module and/or a machine learning module to provide baselining of the plasma chamber, fingerprinting the plasma chamber, monitoring drift in the plasma chamber, chamber matching, or controlling the plasma chamber.

6. A method of fabricating a diagnostic substrate, the method comprising:
   providing a substrate; and
   forming an array of resonators across the substrate, wherein the array of resonators comprises at least a first resonator with a first structure and a second resonator with a second structure, wherein the first structure has a diameter different than a diameter of the second structure, wherein the first structure comprises a first membrane resonating member having a bottom surface a first distance from the substrate, and wherein the second structure comprises a second membrane resonating member having a bottom surface a second distance from the substrate, wherein the first distance is different than the second distance.

7. The method of claim 6, wherein the array of resonators are electromagnetic resonators or acoustic resonators.

8. The method of claim 6, wherein the array of resonators are configured to detect plasma properties, substrate temperature, mass changes, stress changes, or surface potential changes.

9. The method of claim 6, wherein the first structure and the second structure are capacitive resonators or inductive resonators that comprise a membrane, a disk, a beam, or a coil.

10. The method of claim 6, wherein the first structure and the second structure are piezoelectric resonators that comprise a surface acoustic wave (SAW) resonator, a bulk acoustic wave (BAW) resonator, a film bulk acoustic resonator (FBAR), or a transversely excited bulk acoustic resonator (XBAR).

11. The method of claim 6, wherein the first resonator and the second resonator are communicatively coupled to an antenna configured to provide wireless communication of measured frequencies to an external device.

12. The method of claim 6, further comprising:
forming RF circuitry fabricated on the substrate, wherein the RF circuitry comprises one or more of a shielded transmission line, a coupler, and a filter.

13. A method of measuring a plasma parameter in a plasma chamber, comprising:
providing a diagnostic substrate in the plasma chamber, wherein the diagnostic substrate comprises a first resonator with a first geometry and a second resonator with a second geometry;
measuring a baseline response from the first resonator and the second resonator in a vacuum without a plasma;
striking the plasma in the plasma chamber, wherein the first resonator and the second resonator are within the plasma;
measuring a first resonance frequency of the first resonator and a second resonance frequency of the second resonator;
extracting the plasma parameter or a wafer parameter from the first resonance frequency and the second resonance frequency;
applying a first bias around the first resonator; and
applying a second bias around the second resonator, wherein the first bias is different than the second bias, and wherein the first bias and the second bias are modulated biases.

* * * * *